United States Patent
Yeo et al.

(10) Patent No.: US 7,089,947 B2
(45) Date of Patent: Aug. 15, 2006

(54) APPARATUS AND METHOD FOR CLEANING A SEMICONDUCTOR WAFER

(75) Inventors: In-jun Yeo, Suwon (KR); Byoung-moon Yoon, Suwon (KR); Kyung-hyun Kim, Seoul (KR); Sang-rok Hah, Seoul (KR); Jeong-lim Nam, Yongin (KR); Hyun-ho Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 443 days.

(21) Appl. No.: 10/383,607

(22) Filed: Mar. 10, 2003

(65) Prior Publication Data

US 2003/0192571 A1   Oct. 16, 2003

(30) Foreign Application Priority Data

Apr. 15, 2002   (KR) .............................. 2002-20470

(51) Int. Cl.
*B08B 6/00*   (2006.01)

(52) U.S. Cl. .............................. 134/1.3; 134/1; 134/32; 134/184; 134/902

(58) Field of Classification Search ................... 134/1, 134/1.3, 32, 184, 902
See application file for complete search history.

(56) References Cited

U.S. PATENT DOCUMENTS

| 6,039,059 | A | 3/2000 | Bran |
| 6,333,268 | B1 * | 12/2001 | Starov et al. ............... 438/691 |
| 6,543,080 | B1 | 4/2003 | Tomita et al. |

FOREIGN PATENT DOCUMENTS

WO   WO98/14985   *   4/1998

OTHER PUBLICATIONS

Translation of German Office Action dated Jul. 14, 2005.

* cited by examiner

*Primary Examiner*—M. Kornakov
(74) *Attorney, Agent, or Firm*—Harness, Dickey & Pierce, P.L.C.

(57) ABSTRACT

The apparatus for cleaning a wafer includes an energy concentration relieving member positioned at the side of the wafer. An elongated portion of a probe extends over and substantially parallel to the wafer surface. A vibrator is attached to a rear end of the probe for vibrating the probe such that the elongated portion transfers acoustic vibrational energy to the wafer and dislodges debris.

20 Claims, 5 Drawing Sheets

APPARATUS AND METHOD FOR CLEANING A SEMICONDUCTOR WAFER

CROSS REFERENCE TO RELATED APPLICATIONS

This U.S. nonprovisional application claims priority under 35 U.S.C. § 119 to Korean Patent Application No. 2002-20470 filed Apr. 15, 2002, the contents of which are incorporated by reference in its entirety.

BACKGROUND OF THE INVENTION

1. Field of the Invention

The present invention relates to an apparatus and method for cleaning a wafer used in the manufacture of a semiconductor device.

2. Description of the Related Art

Recently, numerous methods for cleaning a wafer using high frequency acoustic energy, such as megasonic energy, have been introduced. An apparatus for cleaning a semiconductor wafer using megasonic energy removes pollutants (e.g., particles) from a wafer surface by providing megasonic energy through the cleaning fluid. One example of an apparatus for cleaning a semiconductor wafer that uses high frequency acoustic energy is the GOLD FINGER cleaning apparatus introduced by Verteq, Inc., which is disclosed in U.S. Pat. No. 6,039,059 (issued on Mar. 21, 2000 to Mario E. Bran, et al.) and hereby incorporated by reference in its entirety. Although, the apparatus for cleaning a semiconductor wafer by providing megasonic energy effectively removes particles from a wafer surface, patterns formed on the wafer are sometimes damaged during the cleaning process. Damage to the patterns includes, for example, lifting of the patterns. In particular, patterns can be severely damaged on the edge of the wafer.

It is known that damage to the patterns occurs due to a concentration of megasonic energy or vibrational energy of fluids. As design rules required for a semiconductor device become more narrow, damage to the patterns can increase. For example, if a line width of the pattern is less than 0.12 µm, damage to the patterns due to the cleaning process can increase.

SUMMARY OF THE INVENTION

At least one exemplary embodiment of the present invention provides an apparatus for cleaning a semiconductor wafer that uses high frequency acoustic energy to clean the wafer. The apparatus includes an energy concentration relieving member that is positioned a distance from the semiconductor wafer to be cleaned. The energy concentration relieving member is formed at a height that is substantially equivalent to (e.g., co-planar to) the surface of the wafer. A probe is positioned substantially parallel to and over at least a portion of the energy concentration relieving member and a portion of the semiconductor wafer. The probe can be formed of a material that is non-reactive compared to solutions used to clean the semiconductor wafer and which easily transmits acoustic energy.

The probe can include an elongated portion, a middle portion, and a connecting portion. The elongated portion is the portion of the probe that extends over the energy concentration relieving member and the semiconductor wafer. The elongated portion can have a cross-section that is substantially the same throughout its entirety, and the cross-section can be circular or oval-shaped. The middle portion is integrally connected to the elongated portion and can have a funnel-shape with a cross-section that gradually increases away from the elongated portion. The middle portion can be positioned outside the energy concentration relieving member. The connecting portion is integrally connected to the middle portion and has a larger cross-section than that of the middle portion. A vibrator is connected at the opposing end of the connecting portion to generate acoustic vibrational energy when a voltage is applied. The vibrator can be made of a piezoelectric material. The acoustic vibrations provided by the vibrator can be ultrasonic waves in the kHz range.

A cleaning liquid can be provided by cleaning liquid providers optionally having nozzles to direct the cleaning liquid to the semiconductor wafer to be cleaned. A cleaning liquid provider can be positioned to direct the cleaning liquid to the top surface of the semiconductor wafer and a cleaning liquid provider can be positioned to direct the cleaning liquid to the bottom surface of the semiconductor wafer. The cleaning liquid can be deionized water or a chemical solution such as an HF solution or a SC1 solution. The cleaning liquid forms a cleaning medium layer on the wafer surface. Because the energy concentration relieving member is positioned substantially co-planar to the semiconductor wafer, the cleaning medium layer can extend continuously from the semiconductor wafer to the energy concentration relieving member.

Optionally, at least a portion of the probe, the energy concentration relieving member, and the semiconductor wafer are positioned in a housing such as a tank. Additionally, a rotation axis may be provided for rotating the semiconductor wafer during the cleaning process.

At least one other exemplary embodiment of the present invention provides a method for cleaning a semiconductor wafer. An energy concentration relieving member is positioned adjacent to and a distance from the semiconductor wafer to be cleaned. The energy concentration relieving member can be positioned at substantially the same height as, and substantially co-planar to, the semiconductor wafer to create a false edge for the semiconductor wafer. The false edge can shift the maximum acoustic power to the energy concentration relieving member.

A probe is positioned over at least a portion of the energy concentration relieving member and a portion of the semiconductor wafer. The probe can include an elongated rod-like portion, a funnel-shaped middle portion, and a connecting portion as described above with respect to an apparatus for cleaning a semiconductor wafer. A vibrator is connected to the end of the probe to generate acoustic vibrational energy. The vibrator can be made of a piezoelectric material. The acoustic vibrations provided by the vibrator can be ultrasonic waves in the kHz range.

A cleaning liquid, such as an HF solution or a SC1 solution, is supplied to the surface of the semiconductor wafer. Because the energy concentration relieving member is positioned substantially co-planar to the semiconductor wafer, the cleaning medium layer is extended continuously from the semiconductor wafer to the energy concentration relieving member.

Once the cleaning medium layer is formed over the semiconductor wafer and at least a portion of the energy concentration relieving member, voltage is applied to the vibrator and acoustic waves are generated by the vibrator. These acoustic waves are transferred to the probe, through the cleaning medium layer, and to the semiconductor wafer. The semiconductor wafer can be independently rotated about a rotation axis to ensure that the entire semiconductor wafer is vibrated by the probe. The acoustic energy transmitted to the surface of the semiconductor wafer by the vibrations of the probe removes pollutants and/or unwanted debris from the semiconductor wafer.

BRIEF DESCRIPTION OF THE DRAWINGS

Exemplary embodiments of the present invention will be readily understood with reference to the following detailed description thereof provided in conjunction with the accompanying drawings in which.

DETAILED DESCRIPTION OF EXEMPLARY EMBODIMENTS OF THE INVENTION

Figure 1:
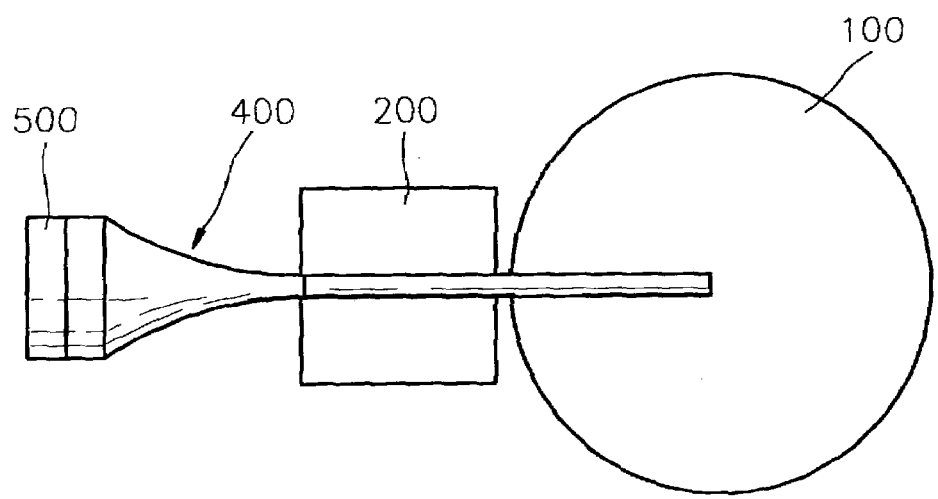
FIG. 1 is a schematic plan view of an apparatus for cleaning a semiconductor wafer according to an exemplary embodiment of the present invention.

Exemplary embodiments of the present invention now will be described more fully below with reference to the accompanying drawings, in which exemplary embodiments of the invention are shown. The invention may, however, be embodied in many different forms and should not be construed as being limited to the exemplary embodiments set forth herein. Rather, these exemplary embodiments are provided so that this disclosure will be thorough and complete, and will fully convey the concepts of the present invention to those skilled in the art. In the drawings, the thickness of layers and regions are exaggerated for clarity. Like reference numerals in different drawings refer to like elements. Also, when it is written that a component or layer is formed "on" another component or layer, the component or layer can be formed directly on the other component or layer, or other components or layers can intervene therebetween.

A general description of a cleaning apparatus for cleaning a semiconductor wafer according to an exemplary embodiment of the present invention will first be described in detail below. Next, a conventional cleaning apparatus will be described and then compared to a cleaning apparatus according to an exemplary embodiment of the present invention. An alternative cleaning apparatus for cleaning a semiconductor wafer according to an exemplary embodiment of the present invention will then be described in detail. Finally, a method of cleaning a semiconductor wafer according to an exemplary embodiment of the present invention will be described.

1. General Description of an Exemplary Embodiment of the Present Invention

An apparatus for cleaning a semiconductor wafer according to an exemplary embodiment of the present invention can reduce damage to patterns located on the edge of a semiconductor wafer by relieving the concentration of acoustic energy from the edge region of the wafer. In an apparatus according to an exemplary embodiment of the present invention, high frequency acoustic energy is supplied to the semiconductor wafer when the wafer is cleaned. Although the present invention will be described with reference to the GOLD FINGER cleaning apparatus of Verteq, Inc., the scope of the present invention is not limited to this exemplary embodiment. In addition, in at least one exemplary embodiment, the apparatus for cleaning a wafer uses ultrasonic waves.

Figure 2:
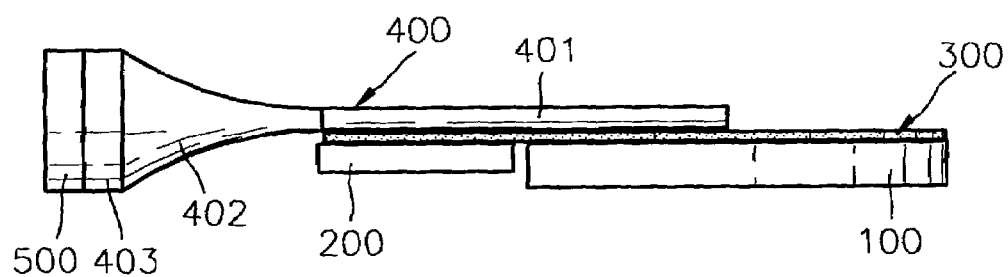
FIG. 2 is a schematic side view of an apparatus for cleaning a semiconductor wafer according to an exemplary embodiment of the present invention.

FIGS. 1 and 2 are a schematic plan and a side view, respectively, of an apparatus for cleaning a semiconductor wafer according to an exemplary embodiment of the present invention. Referring to FIGS. 1 and 2, it can be seen that an apparatus for cleaning a semiconductor wafer includes a probe 400 for providing acoustic energy to a semiconductor wafer 100, a vibrator 500 connected to the probe 400, and an energy concentration relieving member 200 formed at one side of the semiconductor wafer 100 a distance from the edge of the semiconductor wafer 100.

As shown in FIGS. 1 and 2, the end of the probe 400 is positioned a distance from the energy concentration relieving member 200 and the surface of the semiconductor wafer 100. The probe 400 includes an elongated portion 401 positioned substantially parallel to and over the semiconductor wafer 100. In particular, the probe 400 can include an elongated rod-like portion 401, a connecting portion 403 connected to a vibrator 500, and a funnel-shaped middle portion 402 interconnecting the connecting portion 403 and the elongated rod-like portion 401. The cross-section of the middle portion 402 increases gradually toward the connecting portion 403. The elongated portion 401 transmits acoustic vibrational energy to the surface of the semiconductor wafer 100, and has substantially the same cross-section throughout its entirety. The elongated portion 401 can have a circular or oval shape.

A cleaning medium layer 300, which is used as a material for transmitting the acoustic energy, is positioned between the probe 400 and the surface of the semiconductor wafer 100 and the energy concentration relieving member 200. Deionized water or other cleaning liquids such as cleaning chemicals (e.g., an HF solution or an SC1 solution) can be used as the cleaning liquid. If deionized water is used, a liquid layer having a meniscus is formed between the wafer 100 and the probe 400 as the cleaning medium layer 300.

In at least one exemplary embodiment of the present invention, the elongated portion 401 of the probe 400 is positioned to traverse at least a portion of the energy concentration relieving member 200 and a portion of the semiconductor wafer 100. In one exemplary embodiment, the end of the probe 400 is positioned to reach the center of the semiconductor wafer 100 so that the probe 400 can be exposed to the entire surface of the semiconductor wafer 100 by rotating the wafer 100. The elongated portion 401 of the probe 400 may be positioned substantially parallel to the upper surface of the energy concentration relieving member 200 and the surface of the semiconductor wafer 100.

The probe 400 may be formed of a material that is relatively non-active compared to the cleaning medium 300, is not polluted, and which easily and effectively transmits acoustic energy. Suitable examples of the material used to form the probe 400 include sapphire, silicon carbide (SiC), and boron nitride (BN).

The energy concentration relieving member 200, according to exemplary embodiments of the present invention, is substantially the same height as that of the semiconductor wafer 100 (e.g., the energy concentration relieving member 200 is substantially co-planar to the semiconductor wafer 100) which, as described below, decreases damage caused to the edge region of the semiconductor wafer 100. In addition, the energy concentration relieving member 200 can be positioned a distance from the edge of the semiconductor wafer 100 to allow the semiconductor wafer 100 to rotate independently during the cleaning process. The distance between the energy concentration relieving member 200 and the semiconductor wafer 100 may be maintained so that the cleaning medium layer 300 extends continuously from the surface of the semiconductor wafer 100 to the surface of the energy concentration relieving member 200, as shown in FIG. 2. In addition, the energy concentration relieving member 200 decreases damage to the patterns concentrated at the edge of the semiconductor wafer 100 during the cleaning process by preventing acoustic vibrational energy from concentrating on the edge of the semiconductor wafer 100. In particular, the energy concentration relieving member 200 creates a false edge for the semiconductor wafer 100 so that the maximum point of acoustic power is shifted from the edge region of the semiconductor wafer 100 to the energy concentration relieving member 200.

The vibrator 500 can be made of a piezoelectric material and generates acoustic waves when voltage is applied. The high-frequency acoustic wave generated from the vibrator 500 is transmitted to and vibrates the probe 400 connected to the vibrator 500. The acoustic energy transmitted to the surface of the semiconductor wafer 100 by the vibrations of the probe 400 removes pollutants such as particles from the semiconductor wafer 100. Lateral vibrations are transmitted from the vibrator 500 to the probe 400 in a vertical direction.

Figure 3:
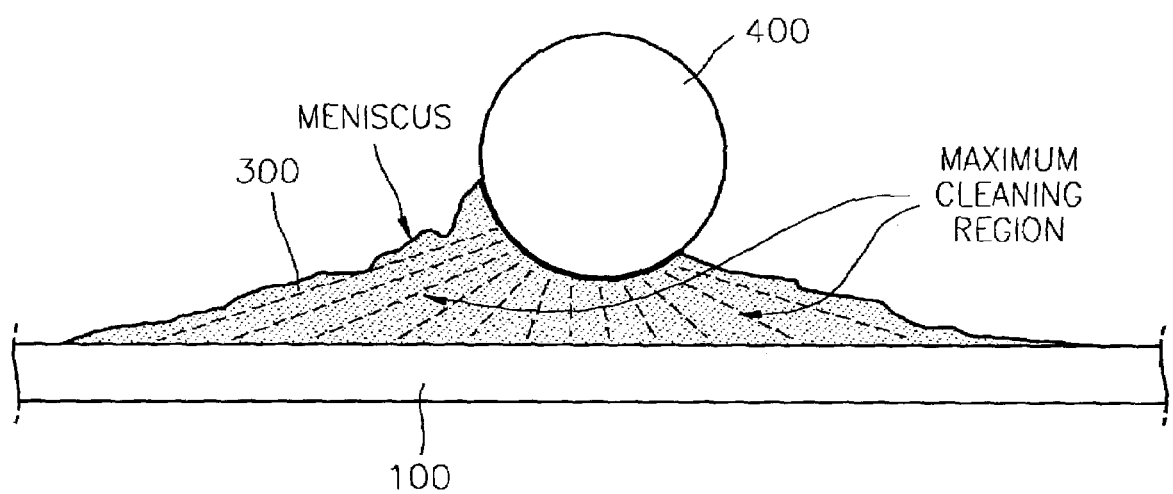
FIG. 3 is an illustration depicting the transmission of acoustic vibrational energy from a probe to a semiconductor wafer via a cleaning medium layer according to an example embodiment of the present invention.

Referring now to FIG. 3, a schematic view illustrating the transmission of acoustic vibrational energy from the probe 400 to the semiconductor wafer 100 via the cleaning medium layer 300 is shown. As illustrated in FIG. 3, the probe 400 on the semiconductor wafer 100 transmits acoustic vibrational energy to the surface of the semiconductor wafer 100 via the cleaning medium layer 300 located between the probe 400 and the semiconductor wafer 100. Vibrational energy, namely, high-frequency acoustic vibrational energy, is transmitted from the vibrator 500 to the probe 400, then through a meniscus on the cleaning medium layer 300, and to the surface of the semiconductor wafer 100.

In an exemplary embodiment, the acoustic vibrational energy applied to the probe 400, e.g., an ultrasonic wave, has a wideband frequency in which a cavitation phenomenon occurs. Cavitation phenomenon is a phenomenon in which an ultrasonic wave produces vapors or bubbles (or cavitations) and causes them to explode in the cleaning medium layer 300. In particular, cavitation refers to a phenomenon where very high frequency waves, such as ultrasonic waves, produce a large amount of energy and vapors when the waves are transmitted through a liquid. Although not wishing to be bound by theory, there are some hypotheses of the causes of the cavitation phenomenon. For example, one theory suggests that small vapors in the liquid layer repeat expansion and contraction tens of thousands of times per second as a result of tension applied to the liquid by the ultrasonic waves. In an exemplary embodiment of the present invention, the frequency of the acoustic energy is in the range of kHz. If the frequency of the ultrasonic waves is greatly increased, the cohesive power of the liquid molecules is broken down so that more than tens of millions of small cavities are created. If vapors produced in low pressure explode in high pressure, the cavitation phenomenon can occur.

When small cavities or vapors explode due to the cavitation phenomenon, a large amount of energy is emitted. Thus, it is possible to clean an object in liquid, both on the surface and in deep portions of the object, within a short period of time. The vapors or cavities produced during cavitation are so small that they are useful for precise cleaning or for cleaning a narrow space. When an ultrasonic wave is generated in a cleaning medium or a cleaning liquid, cavities are repeatedly regenerated and destroyed. The pollutants in the object to be cleaned are separated at a pressure of about 1000 atms as a result of repeatedly generating and destroying cavities. In addition, the cleaning can be increased by effects accompanying the cavitation phenomenon, such as promotions or dispersions of chemical responses, agitation of the cleaning liquid, removal of fats, emulsification, etc.

The amount of produced vapors (or bubbles) and the extent of the cavitation phenomenon changes depending on various factors such as the temperature of the cleaning medium layer, the applied frequencies, and the structure or thickness of the material transmitting the ultrasonic waves to a liquid. The lower the frequency, the stronger the cavitation. Accordingly, cavitation at a very low frequency is good for removing particles. However, cavitation at low frequencies can also damage patterns on the semiconductor wafer. Therefore, one exemplary embodiment of the present invention uses ultrasonic waves having a frequency in the range of 800 kHz–950 kHz to produce micro-sized cavitations. In an exemplary embodiment of the present invention, an acoustic energy of a frequency range of 880±50 kHz can be generated. Very effective cleaning is possible, especially at 840, 905, and 915 kHz, without damaging the patterns on the semiconductor wafer.

2. Conventional Cleaning Apparatus

Figure 4:
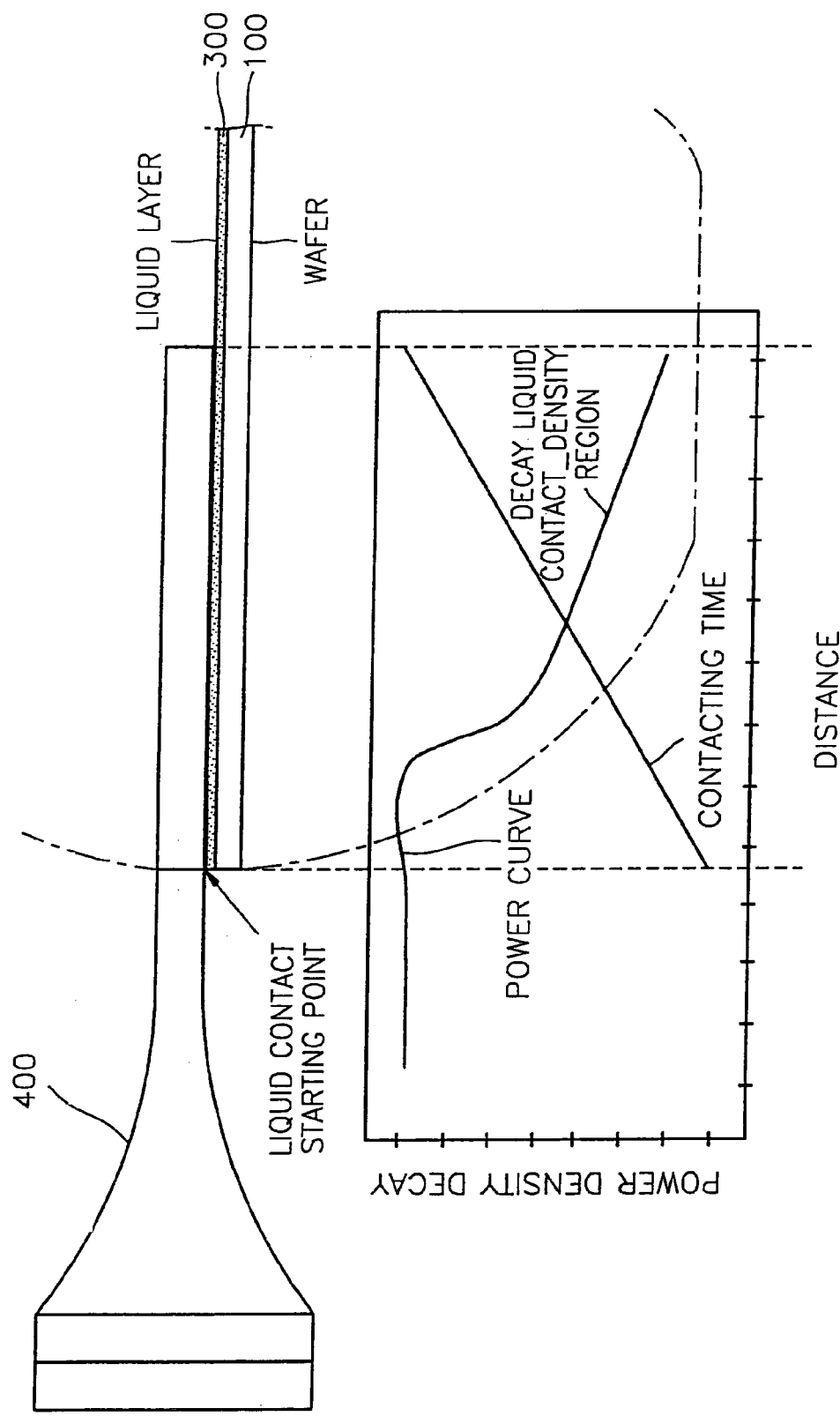
FIG. 4 is a schematic view illustrating the decrease of acoustic power in a conventional semiconductor wafer cleaning apparatus.

FIG. 4 shows a curve that depicts a decrease of acoustic power toward an inner direction from a starting point where the probe contacts the cleaning medium layer in a conventional semiconductor wafer cleaning apparatus. In particular, the curve illustrates the decay of acoustic power applied to the semiconductor wafer 100 when the semiconductor wafer 100 is cleaned by applying acoustic vibrational energy and the probe 400 is positioned over the semiconductor wafer 100. The curve of decreasing acoustic power is shown with respect to the distance in the length of the probe 400 contacting the semiconductor wafer 100.

FIG. 4 shows a decrease in the acoustic power toward an inner direction from the starting point of the probe 400 contacting the liquid layer. As shown in FIG. 4, if the energy concentration relieving member 200, according to one exemplary embodiment of the present invention, is not introduced, the probe 400 first contacts the cleaning medium layer 300 at the edge of the semiconductor wafer 100. In this example, the probe 400 is positioned approximately ¾λ (λ is the frequency of an acoustic wave), e.g., 1.4 mm, over the surface of the semiconductor wafer 100. At this distance, the acoustic pressure of cavity explosion transferred to the semiconductor wafer 100 is increased. FIG. 4 shows that the curve of decay of acoustic power density of the probe 400 has a maximum value at the edge portion of the wafer 100, and that the acoustic power curve decreases toward the inner direction of the wafer 100. According to the power curve, the maximum power density point is on the edge region of the semiconductor wafer 100.

3. Comparison of a Conventional Cleaning Apparatus and an Exemplary Embodiment of the Present Invention Damage to the patterns on the semiconductor wafer 100 caused by a cleaning process typically occurs in the edge portion of the wafer 100 because the acoustic power has a maximum value at the edge of the wafer 100. As seen in FIG. 4, the power curve decreases toward the end of the probe 400 which contacts the liquid layer. It is believed that if the point where the probe 400 first contacts the liquid layer is moved outside the semiconductor wafer 100, the acoustic power will be prevented from concentrating at the edge of the wafer 100. In this regard, the energy concentration relieving member 200 is positioned outside of the semiconductor wafer 100 to reduce the acoustic energy concentrated at the edge of the semiconductor wafer 100.

Figure 5:
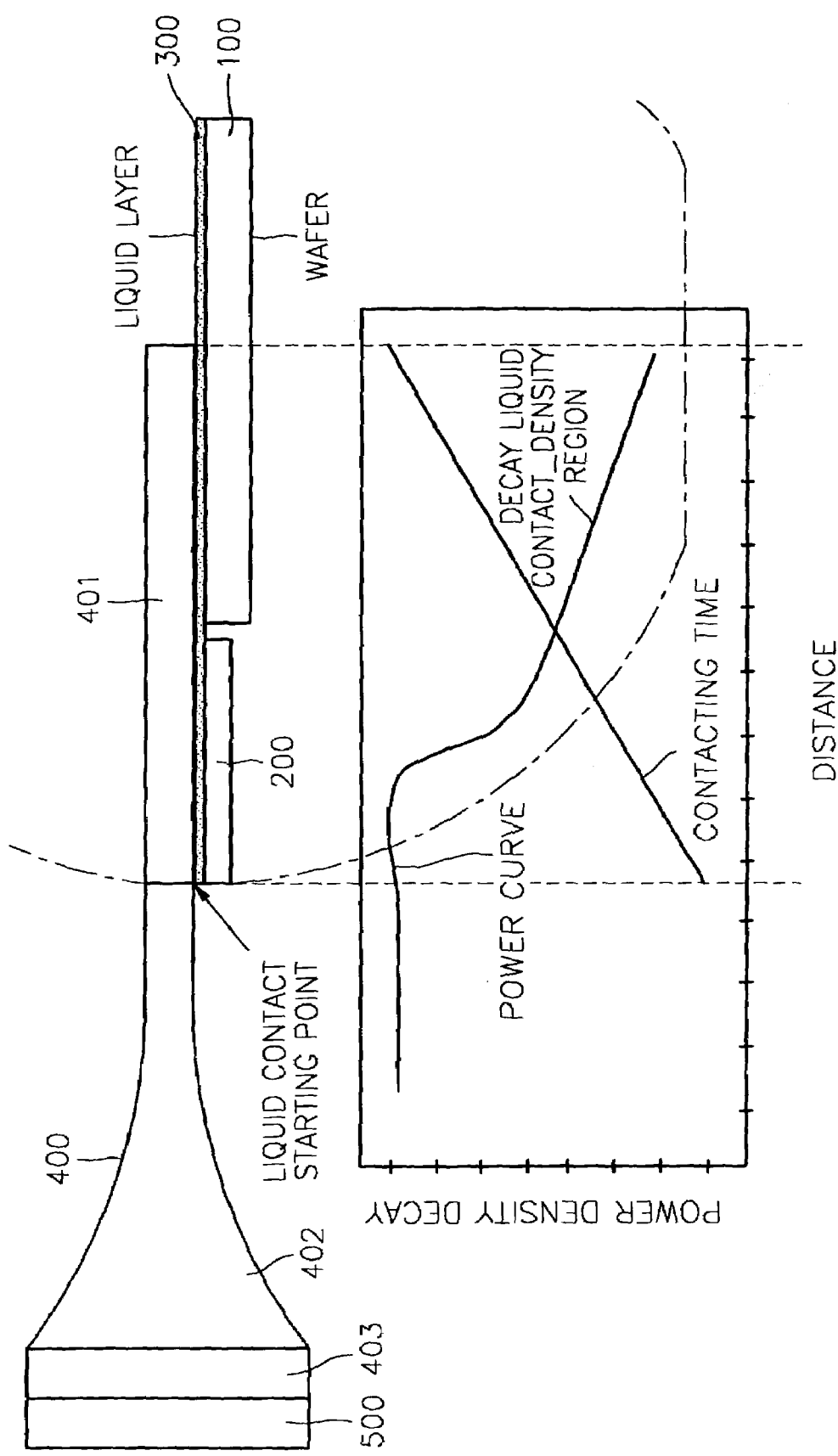
FIG. 5 is a schematic view illustrating the decrease of acoustic power in an exemplary embodiment of the present invention.

As shown in FIG. 5, the curve of decay of acoustic power density of the probe 400 in an exemplary embodiment of the present invention also has a maximum value in the portion that first contacts the liquid layer; however, the portion that first contacts the liquid layer is the edge portion of the energy concentration member 200, and not the semiconductor wafer 100 as in the conventional cleaning apparatus illustrated in FIG. 4. In FIG. 4, if the semiconductor wafer 100 were to be expanded radially outward, the maximum point of the acoustic power curve may be shifted outwardly from the edge of the semiconductor wafer. By positioning the energy concentration relieving member 200 at substantially the same height as the surface of the semiconductor wafer 100 and a distance from the semiconductor wafer 100, the maximum point of acoustic power can be shifted outward from the surface of the semiconductor wafer 100 and to the energy concentration relieving member 200, as shown in FIG. 5. Thus, the energy concentration relieving member 200 reduces damage to patterns formed on the edge region of the semiconductor wafer 100 by creating a false edge for the semiconductor wafer 100 and shifting the maximum point of acoustic power from the edge region of the semiconductor wafer 100 to the edge of the energy concentration relieving member 200. In particular, the energy concentration relieving member 200 creates a false edge for the semiconductor wafer 100 so that the acoustic power generated by the vibrator 500 occurs at the edge of the energy concentration relieving member 200 and not at the wafer edge. In the exemplary embodiment of the present invention depicted in FIG. 5, damage arising from the maximum point of the acoustic power curve being positioned over the edge region of the semiconductor wafer 100 can therefore be reduced.

The energy concentration relieving member 200 is positioned adjacent to the semiconductor wafer 100 in the same direction as the probe 400. In addition, the energy concentration relieving member 200 is positioned a distance from the semiconductor wafer 100 so that the cleaning medium layer 300 formed on the semiconductor wafer 100 extends continuously from the semiconductor wafer 100 to the energy concentration relieving member 200.

Further, the energy concentration relieving member 200 is formed flat and at substantially the same height as that of the semiconductor wafer 100 (e.g., the energy concentration relieving member 200 is substantially co-planar to the semiconductor wafer 100) so that the cleaning medium layer 300 extends continuously to the energy concentration relieving member 200. The elongated portion 401 of the probe 400 is positioned to be substantially parallel to the surface of the energy concentration relieving member 200. Accordingly, the point where the elongated portion 401 of probe 400 first contacts the cleaning medium layer 300 is positioned within the energy concentration relieving member 200.

As shown in FIG. 5, and unlike the conventional cleaning apparatus depicted in FIG. 4, the starting point corresponding to the maximum acoustic power of the elongated portion 401 of the probe 400 that contacts the cleaning medium layer 300 may be positioned on an edge portion of the energy concentration relieving member 200 a distance from the semiconductor wafer 100 in an opposing direction. In addition, because the acoustic power density decreases toward the inner side from the contact starting point, the acoustic power also decreases toward the inner direction of the energy concentration relieving member 200 to the semiconductor wafer 100, as illustrated in FIG. 5. Accordingly, a decreased power density is applied to the edge of the semiconductor wafer 100, and damage to the patterns, which usually occurs at the edge of the semiconductor wafer 100, may therefore be reduced.

4. Alternative Exemplary Embodiment of the Present Invention

Figure 6:
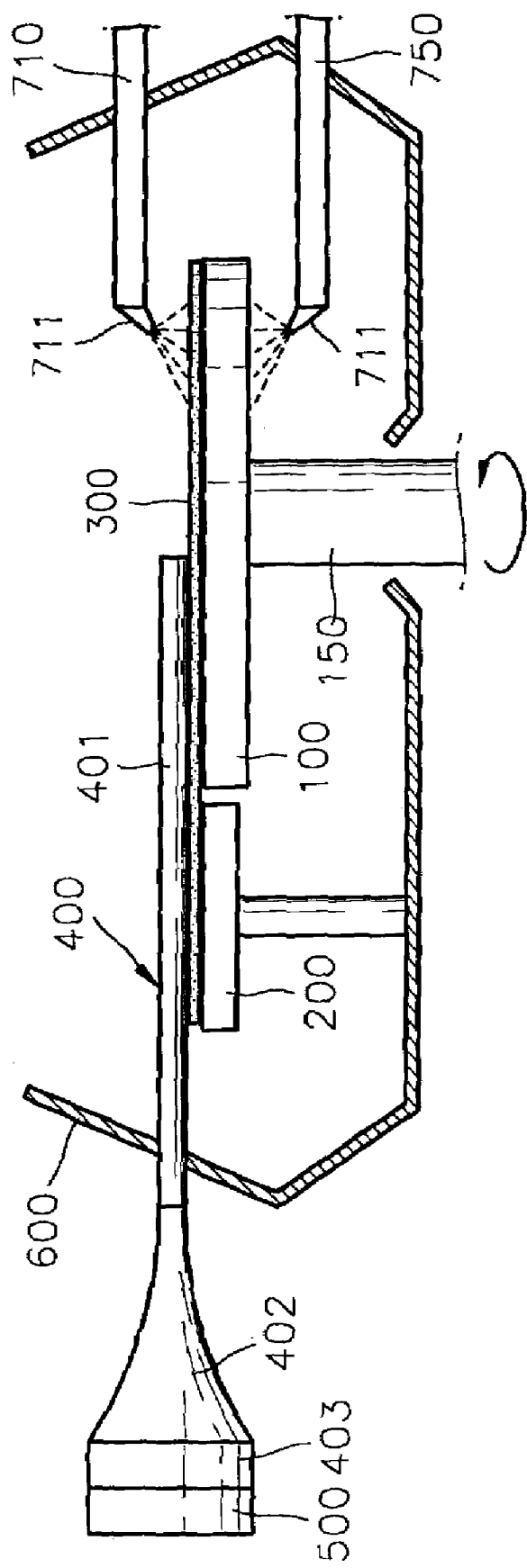
FIG. 6 is a schematic view illustrating an apparatus for cleaning a wafer equipped with a cistern and a cleaning fluid provider according to an exemplary embodiment of the present invention.

FIG. 6 is a schematic view illustrating an apparatus for cleaning a semiconductor wafer 100 that includes a tank 600 and cleaning medium providers 710 and 750 according to an alternative exemplary embodiment of the present invention. As shown in FIG. 6, the apparatus also includes a rotation axis 150 for rotating the semiconductor wafer 100 during the cleaning process and a supporting unit (not shown) equipped on the rotation axis 150 on the semiconductor wafer 100.

The first cleaning medium provider 710 can be positioned over the semiconductor wafer 100 to provide a cleaning liquid, (e.g., deionized water or a chemical solution such as an HF solution or a SC1 solution) to form a cleaning medium layer 300 on the upper surface of the semiconductor wafer 100. The first cleaning medium provider 710 can further include a nozzle 711. The second cleaning medium provider 750, optionally having a nozzle 751, can be positioned to provide a cleaning liquid to the lower portion of the semiconductor wafer 100.

The energy concentration relieving member 200 is positioned adjacent to the semiconductor wafer 100 a distance from the semiconductor wafer 100 so that the semiconductor wafer 100 can rotate independently during the cleaning process. The cleaning medium layer 300 can be extended continuously from the semiconductor wafer 100 to the energy concentration relieving member 200. In addition, the elongated portion 401 of the probe 400 contacts the cleaning medium layer 300 extended on the energy concentration relieving member 200. Therefore, acoustic energy concentrated on the edge of the semiconductor wafer 100 can be reduced. The rotation axis 150 and the energy concentration relieving member 200 can be formed inside the tank 600.

5. Methods of Cleaning a Semiconductor Wafer According to Exemplary Embodiments of the Present Invention To clean a semiconductor wafer according to one exemplary embodiment of the present invention, an energy concentration relieving member 200 is positioned adjacent to and a distance from the semiconductor wafer 100 to be cleaned. The energy concentration relieving member 200 can be positioned at substantially the same height as (e.g., can be positioned to be substantially co-planar to) the semiconductor wafer 100, thereby creating a false edge for the semiconductor wafer. As described in detail above, the false edge shifts the maximum acoustic power from the true edge of the semiconductor wafer 100 to the energy concentration relieving member 200. By shifting the majority of the power to the energy concentration relieving member 200, damage to patterns positioned on the edge of the semiconductor wafer 100 can be reduced.

A probe 400 is positioned over at least a portion of the energy concentration relieving member 200 and a portion of the semiconductor wafer 100. The probe can include an elongated portion 401, a funnel-shaped middle portion 402, and a connecting portion 403 connecting the funnel shaped middle portion 402 to a vibrator 500. The probe 400 can be positioned substantially parallel to the semiconductor wafer 100.

A cleaning liquid is supplied, such as by cleaning liquid providers 710 and 750, to the surface of the semiconductor wafer 100. The cleaning liquid can be a liquid such as deionized water or a cleaning solution such as an HF solution or a SC1 solution. This cleaning liquid forms a cleaning medium layer 300 between the semiconductor wafer 100 and the probe 400. The distance from the semiconductor wafer to the energy concentration relieving member 200 is such that the cleaning medium layer 300 extends continuously to the energy concentration relieving member 200.

Once the cleaning medium layer is formed over the semiconductor wafer 100 and at least a portion of the energy concentration relieving member 200, voltage is applied to the vibrator 500 and acoustic waves generated by the vibrator 500 are transferred to the probe 400, through the cleaning medium layer 300, and to the semiconductor wafer 100. The semiconductor wafer 100 may be independently rotated about a rotation axis 150 to ensure that the entire semiconductor wafer 100 is vibrated by the acoustic vibrations. The acoustic energy transmitted to the surface of the semiconductor wafer 100 by the vibrations of the probe 400 removes pollutants and/or unwanted debris from the semiconductor wafer 100.

Although exemplary embodiments of the present invention have been described in detail hereinabove, it will be understood by those skilled in the art that various changes in form and details may be made therein without departing from the spirit and scope of the present invention as defined by the appended claims.

What is claimed is:

1. An apparatus for cleaning a semiconductor wafer comprising:
    an acoustic energy concentration relieving member, the energy concentration relieving member being positioned at a side portion of the wafer to allow the wafer to rotate independently of the acoustic energy concentration relieving member;
    a probe with a portion thereof extending across at least a portion of the acoustic energy concentration relieving member and a portion of the wafer, the acoustic energy concentration relieving member creating a false edge for the wafer by positioning the acoustic energy concentration relieving member adjacent to the wafer in order to relieve acoustic energy imparted to the wafer when the probe is vibrated to dislodge unwanted debris from the wafer; and
    a vibrator connected to an end of the probe.

2. The apparatus of claim 1, wherein the probe includes an elongated portion.

3. The apparatus of claim 2, wherein the probe has a length sufficient for an end of the elongated portion of the probe to reach the center of the wafer.

4. The apparatus of claim 1, wherein the vibrator causes the probe to generate ultrasonic waves in the kHz range.

5. The apparatus of claim 4, wherein the ultrasonic waves have a range of approximately 800–950 kHz.

6. The apparatus of claim 1, wherein a top surface of the energy concentration relieving member is formed at a height substantially equivalent to the top surface of the wafer.

7. The apparatus of claim 1, further comprising:
    a cleaning medium layer that continuously extends from a top surface of the wafer to a top surface of the energy concentration relieving member.

8. The apparatus of claim 7, further comprising:
    a cleaning medium provider for providing a cleaning liquid for forming the cleaning medium layer on the top surface of the wafer.

9. The apparatus of claim 8, wherein the cleaning liquid is selected from the group consisting of deionized water, an HF solution and a SC1 solution.

10. The apparatus of claim 8, further comprising:
    a rotatable supporting unit supporting the wafer.

11. The apparatus of claim 8, wherein the cleaning medium provider includes a nozzle to direct the cleaning liquid to the top surface of the wafer.

12. The apparatus of claim 2, wherein the elongated portion of the probe has a cross-section that is substantially the same throughout the elongated portion.

13. The apparatus of claim 12, wherein the cross-section of the elongated portion of the probe is circular or oval shaped.

14. The apparatus of claim 12, wherein the probe further includes:
    a connecting portion having a cross-section that is larger than the cross-section of the elongated portion, the connecting portion being connected to the vibrator, and
    a middle portion having a cross-section which gradually increases in size from the elongated portion to the connecting portion.

15. The apparatus of claim 14, wherein the elongated portion of the probe traverses an entire portion of the energy concentration relieving member and the middle portion is positioned outside the energy concentration relieving member.

16. A method of cleaning a semiconductor wafer comprising:
    creating a false edge for the wafer by positioning an acoustic energy relieving member adjacent to the wafer to allow the wafer to rotate independently of the acoustic energy relieving member and to relieve acoustic energy imparted to the wafer when a probe is vibrated to dislodge unwanted debris from the wafer;
    placing the probe over the wafer such that at least a portion of the probe traverses a portion of the wafer and a portion of the acoustic energy relieving member; and
    vibrating the probe to dislodge unwanted debris from the wafer.

17. The method of claim 16, wherein a top surface of the false edge is positioned at substantially the same height as a top surface of the wafer.

18. The method of claim 16, further comprising:
    applying a liquid medium to the wafer prior to the placing step, the liquid medium extending across the wafer and at least a portion of the false edge.

19. The method of claim 18, further comprising:
    rotating the wafer.

20. The method of claim 18, wherein the vibrating step vibrates the probe with ultrasonic waves having a range of 800–950 kHz.

* * * * *